(12) United States Patent
Kang

(10) Patent No.: US 8,927,433 B2
(45) Date of Patent: Jan. 6, 2015

(54) CONDUCTIVE VIA HOLE AND METHOD FOR FORMING CONDUCTIVE VIA HOLE

(75) Inventor: Jin-Yeong Kang, Daejeon (KR)

(73) Assignee: Electronics and Telecommunications Research Institute, Daejeon (KR)

(*) Notice: Subject to any disclaimer, the term of this patent is extended or adjusted under 35 U.S.C. 154(b) by 1057 days.

(21) Appl. No.: 12/969,469

(22) Filed: Dec. 15, 2010

(65) Prior Publication Data

US 2011/0147938 A1 Jun. 23, 2011

(30) Foreign Application Priority Data

Dec. 18, 2009 (KR) .......... 10-2009-0126704
Apr. 19, 2010 (KR) .......... 10-2010-0035906

(51) Int. Cl.
*H01L 21/311* (2006.01)
*H01L 21/768* (2006.01)
*H01L 21/288* (2006.01)
*H01L 23/48* (2006.01)

(52) U.S. Cl.
CPC ........ *H01L 21/76898* (2013.01); *H01L 21/288* (2013.01); *H01L 23/481* (2013.01)
USPC ........... 438/700; 438/270; 438/650; 438/686; 438/712; 257/E21.006; 257/E21.077; 257/E21.126; 257/E21.127; 257/E21.17; 257/E21.218; 257/E21.267; 257/E21.278; 257/E21.293; 257/E21.311; 257/E21.319; 257/E21.321; 257/E21.546; 257/E21.547; 257/E21.548

(58) Field of Classification Search
USPC ......... 438/700, 270, 650, 686, 712, 509, 513, 438/474, 475, 769; 257/E21.006, E21.077, 257/E21.126, E21.127, E21.17, E21.218, 257/E21.267, E21.278, E21.293, E21.311, 257/E21.319, E21.321, E21.546, E21.547, 257/E21.548
See application file for complete search history.

(56) References Cited

U.S. PATENT DOCUMENTS

| | | | | |
|---|---|---|---|---|
| 5,252,195 | A * | 10/1993 | Kobayashi et al. ........... | 205/126 |
| 5,454,927 | A * | 10/1995 | Credle et al. ................. | 205/123 |
| 6,727,176 | B2 * | 4/2004 | Ngo et al. .................... | 438/660 |
| 7,166,502 | B1 | 1/2007 | Kwon | |
| 7,569,479 | B2 * | 8/2009 | Kim .............................. | 438/625 |
| 8,309,974 | B2 * | 11/2012 | Nakayama et al. ............ | 257/81 |
| 2004/0038529 | A1 | 2/2004 | Soininen et al. | |
| 2007/0134912 | A1 | 6/2007 | Kim | |

FOREIGN PATENT DOCUMENTS

| | | |
|---|---|---|
| JP | 2004-281154 A | 10/2004 |
| KR | 10-1998-0012394 A | 4/1998 |
| KR | 10-2001-0046141 A | 6/2001 |
| KR | 10-2003-0007612 A | 1/2003 |
| KR | 10-2003-0056391 A | 7/2003 |
| KR | 10-2005-0045394 A | 5/2005 |
| KR | 10-2005-0067831 A | 7/2005 |
| KR | 10-0702797 B1 | 4/2007 |

* cited by examiner

Primary Examiner — David Nhu

(57) ABSTRACT

Provided is a technology for forming a conductive via hole to implement a three dimensional stacked structure of an integrated circuit. A method for forming a conductive via hole according to an embodiment of the present invention comprises: filling inside of a via hole structure that is formed in one or more of an upper portion and a lower portion of a substrate with silver by using a reduction and precipitation of silver in order to connect a plurality of stacked substrates by a conductor; filling a portion that is not filled with silver inside of the via hole structure by flowing silver thereinto; and sublimating residual material of silver oxide series, which is generated during the flowing, on an upper layer inside of the via hole structure filled with silver.

15 Claims, 6 Drawing Sheets

CONDUCTIVE VIA HOLE AND METHOD FOR FORMING CONDUCTIVE VIA HOLE

CROSS REFERENCE TO RELATED APPLICATION

This application claims the benefit of Korean Patent Application No. 10-2009-0126704, filed on Dec. 18, 2009 and Korean Patent Application No. 10-2010-0035906, filed on Apr. 19, 2010, which are hereby incorporated by reference in its entirety into this application.

BACKGROUND OF THE INVENTION

1. Field of the Invention

The present invention relates to a technology for filling a via hole that is formed in a semiconductor chip configured with an integrated circuit that includes a semiconductor chip having a stacked structure by using a conductor to electrically connect the upper and lower semiconductor chips to each other with a conductor. More particularly, the present invention relates to a technology for reducing a size of a via hole and filling the via hole with a desirable conductor by using a predetermined method, which is capable of being applied to the fine via hole that has a good conductivity.

2. Description of the Related Art

Since a function of integrated circuit has become more various, the configuration of the integrated circuit has been making rapid progress at a system level. Accordingly, stacking of chips that are made of various materials with various functions in three dimensions is on the rise as an important issue.

In order to stack the chips in three dimensions, it is necessary to vertically form the via holes through the chips and connect them with a conductor. The depth is generally several tens μm, and the diameter of the hole is reduced from several tens μm to several μm. In the process for forming the via hole, filling the narrow and deep via hole with desirable conductor is desperately needed and a difficult technology.

SUMMARY OF THE INVENTION

It is an object of the present invention to efficiently fill a narrow and deep via hole with silver. More particularly, it is an object of the present invention to provide a technology for filling the via hole having a small size with silver and reducing cost when it is filled with silver. It is another object of the present invention to provide a technology for maintaining high purity of silver which is filled inside of the via hole to perform filling with the desirable conductor.

An embodiment of the present invention provides a method for forming a conductive via hole comprises: filling inside of a via hole structure that is formed in one or more of an upper portion and a lower portion of a substrate with silver by using a reduction and precipitation of silver in order to connect a plurality of stacked substrates by a conductor; filling a portion that is not filled with silver inside of the via hole structure by flowing silver thereinto; and sublimating residual material of silver oxide series, which is generated during the flowing, on an upper layer inside of the via hole structure filled with silver.

The filling inside of the via hole structure means filling the silver by using the reduction and precipitation reaction of silver nitrate ($AgNO_3$) series compound. It is preferable that it means reducing and precipitating the silver by adding a material that has an aldehyde group (—CHO) to an alkali series aqueous (for example, ammonia) solution of the silver nitrate series compound. Thereby, inside of the via hole structure is filled with silver.

Meanwhile, the filling a portion that is not filled with silver is performed in a state of a first temperature range (for example, 300 to 400° C.), a state under a first pressure (for example, under 0.001 Torr), and a state in which a predetermined amount of oxygen is included in the air (for example, 3% of the air amount).

Meanwhile, the sublimating is performed in a state of a second temperature range (for example, 190 to 300° C.), a state under the first pressure, and a state in which a predetermined amount of hydrogen is included in the air.

Meanwhile, before the filling the silver inside of the via hole structure, the method may further comprise forming (that is, deposing) an insulation film on the via hole structure that is formed in a predetermined depth at the substrate. The forming the insulation film uses one or more methods of ozone TEOS (Tetraethly orthosilicate) and high temperature LPCVD HTO (Low Pressure Chemical Vapor Deposition High Temperature Oxide). The insulation film includes one or more of silicon oxide film ($SiO_2$) and silicon nitroxide film (SiON).

The method may further comprise depositing a barrier film to prevent diffusion of a conductive metal and interface reaction between the insulation film and silver on the surface of the formed insulation film. The barrier film includes one or more components of TiN, WN, TiW, and Ti/Pd. In addition, the barrier film is deposited by using a metal ALD (Atomic Layer Deposition) method.

If inside of the via hole is filled with silver, the method further comprises completely forming the via hole by exposing the via hole structure at the opposite side by polishing the opposite side of the via hole structure that is filled with silver in the upper portion or the lower portion of the substrate, that is, the opposite side of the side that is filled in order to form the via hole structure.

An embodiment of the present invention provides a conductive via hole comprises: an insulation film that is formed in an inner wall of a via hole structure; a barrier film that is formed on the surface of the insulation film to prevent diffusion of a conductive metal and interface reaction; and silver that filled inside of the via hole structure which the prevention film is deposited by reduction and precipitation reaction of the silver which has a purity of 95 to 100%.

The silver may be reduced and precipitated by adding a material that includes an aldehyde group to an alkali series aqueous solution of a silver nitrate series compound.

In addition, the insulation film includes one or more of silicon oxide film ($SiO_2$) and silicon nitroxide film (SiON), and the barrier film includes one or more components of TiN, WN, TiW, and Ti/Pd.

According to the embodiments of the present invention, since the via hole structure can be filled with silver that is a desirable conductor while having high purity, it is possible to increase conductivity (or small electric resistance). In addition, since the size of silver particles that are precipitated by using a precipitation reaction is very small, it is easy to fill the very small via hole structure. Since the via hole structure is filled by using the reduction and precipitation reaction of silver that is relatively inexpensive, it is possible to lower cost.

DETAILED DESCRIPTION OF THE PREFERRED EMBODIMENTS

Hereinafter, a method for forming a conductive via hole and a conductive via hole according to an embodiment of the present invention will be described with reference to FIGS. 1 to 10.

First, FIGS. 1 to 8 are examples of a process for forming a conductive via hole by a method of an embodiment of the present invention.

Figure 1:
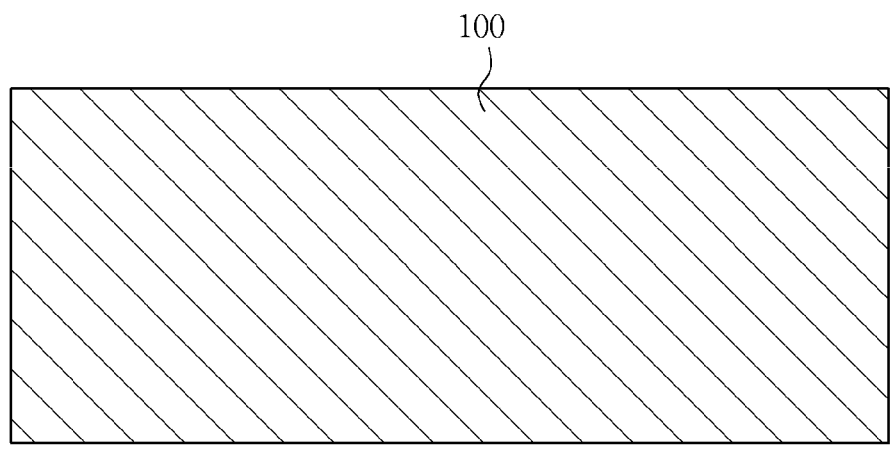
FIGS. 1 to 8 are examples of a process for forming a conductive via hole by a method of an embodiment of the present invention.

With reference to FIG. 1, a substrate 100 means a plate on which elements that comprise a metal line and are necessary to perform a semiconductor function are installed in an integrated circuit. In the embodiment of the present invention, a silicon wafer is used as the substrate 100, but any material may be feasible as long as it can be used as the substrate.

Figure 2:
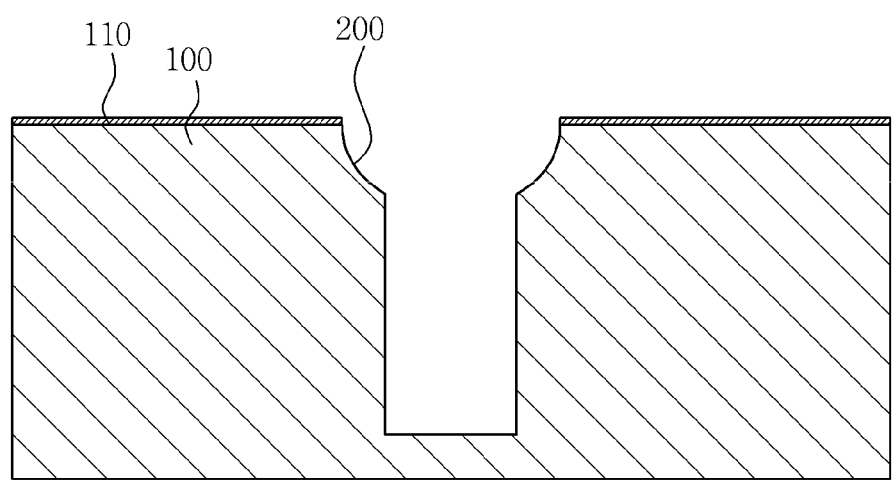

FIG. 2 illustrates a state in which a via hole structure 200 is formed on the substrate 100. The via hole structure 200 means a deep trench structure that is required to form the via hole. In order to form the via hole structure 200, when the substrate 100 is etched, the masking layer 110 that is on the upper portion of the substrate 100 is coated by using an LPCVD (Low Pressure Chemical Vapor Deposition) method. The masking layer 110 is coated by using one or more of $SiO_2$ and $Si_3N_4$ components.

In order to generate the via hole structure 200, when the substrate 100 is etched, for example, a plasma/RIE reactive ion etching apparatus may be used.

When the plasma/RIE reactive ion etching apparatus is used, at an early stage, plasma is generated by using only a SF6 component gas to perform isotropic etching, and a C4F8 component gas is introduced to perform vertical etching by using an anisotropic reactive ion etching mode. When the etching is performed, the etching depth may be a predetermined depth (for example, 30 to 80 μm). In addition, the etching width (diameter) may be a predetermined diameter (for example, 3 to 40 μm). The etching depth and width may be changed according to the requirement when layering is performed to configure a three dimensional integrated circuit.

Figure 3:
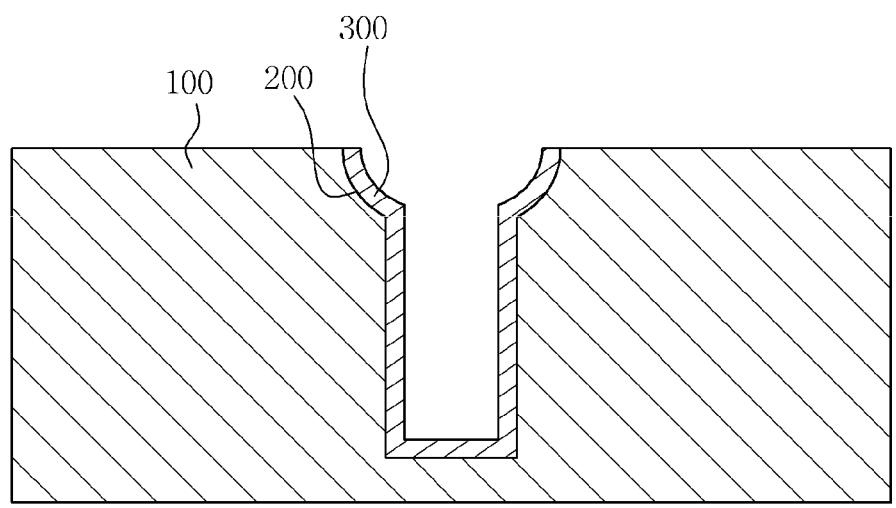

FIG. 3 illustrates a state in which an insulation film 300 is formed in order to electrically insulate the inside of the via hole structure 200 that is formed on the substrate 100 from the external substrate 100.

The insulation film 300 may be one or more of a silicon oxide film $SiO_2$ or a silicon nitroxide film SiON in the embodiment of the present invention. However, in addition to this, generally, any film may be used as the insulation film 300 as long as it includes the component that is used for electrical insulation.

The method for forming the insulation film 300, for example, may be one or more methods of ozone TEOS (Tertaethly orthosilicate) and high temperature LPCVD THO (Low Pressure Chemical Vapor Deposition High Temperature Oxide). By forming the insulation film 300, the conductive component that is filled in the substrate 100 and via hole structure 200 is electrically insulated.

Figure 4:
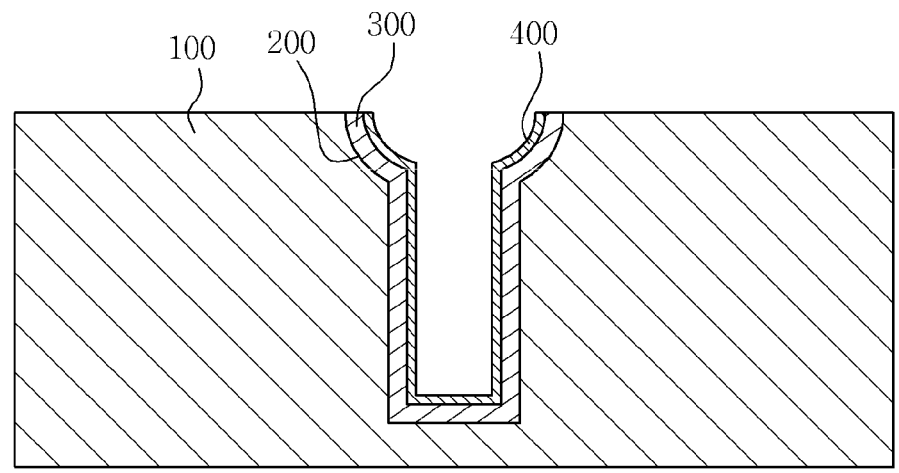

FIG. 4 illustrates, for example, the substrate 100 in a state in which the barrier film 400 is deposited in order to prevent the conductor (for example, silver) from diffusing to the insulation film 300 of the side wall of the via hole structure 200.

The barrier film 400 may include one or more components of titanium nitride TiN, tungsten nitride WN, the compound of titanium and tungsten TiW, and the titanium palladium alloy Ti/Pd in the embodiment of the present invention. The prevention film 400 may have a thickness of, for example, 100 to 500 Å.

The method for forming the barrier film 400 may be a metal ALD (atomic layer deposition) method.

Figure 5:
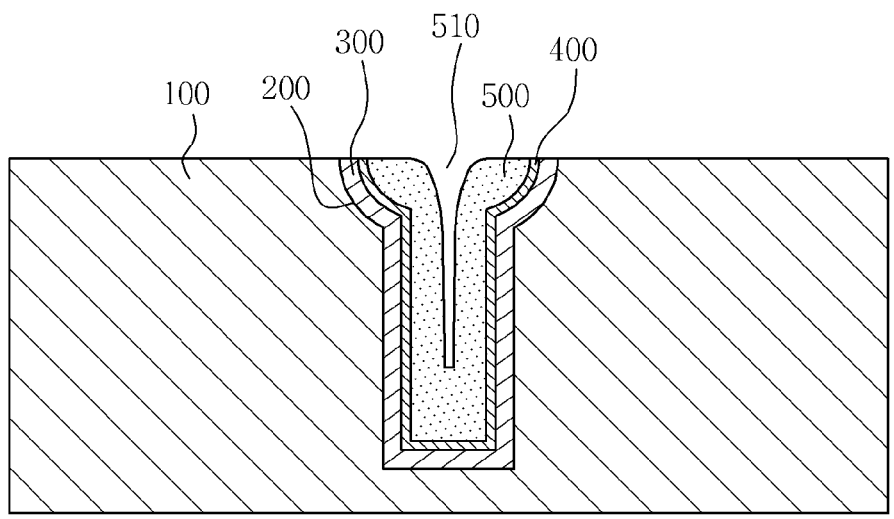

FIG. 5 illustrates the filling of silver 500 inside of the via hole structure after the insulation film 300 and barrier film 400 are formed.

The process for filling silver means a process in which silver is reduced and precipitated by using the silver nitrate $AgNO_3$ series compound in the embodiment of the present invention.

For example, silver may be reduced and precipitated by adding the material that includes the aldehyde group —CHO to the silver nitrate alkali series aqueous solution.

More particularly, first, the silver nitrate aqueous solution is filled in the space between the via hole structure 200 and the barrier film 400, and ammonia water is added to the silver nitrate aqueous solution. If the ammonia water is added, sediment is generated, and if the ammonia water is continuously added thereto, the sediment starts to be dissolved. If all the sediment is dissolved, the addition of ammonia water is stopped. As a result, the ammonia silver nitrate solution is generated.

Next, if the formalin solution is added to the ammonia silver nitrate solution and the temperature is increased (for example, warming in a double water boiler), silver is precipitated. In the process for precipitating silver, formula is as follows.

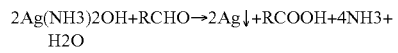

$$2Ag(NH3)2OH+RCHO \rightarrow 2Ag\downarrow+RCOOH+4NH3+H2O \quad \text{[Formula 1]}$$

If the above process is repeated, the space in the via hole structure 200 from the barrier film 400 is filled with the silver 500. However, since the silver 500 is precipitated and filled by using the reduction and precipitation reaction, the void space that the silver is not filled may be created.

For example, as shown in the drawings, the deep valley space 510 may be insufficiently filled with silver, and a void layer may be formed in the silver 500. Accordingly, a process for filling the portion that is insufficiently filled with silver is required.

Figure 6:
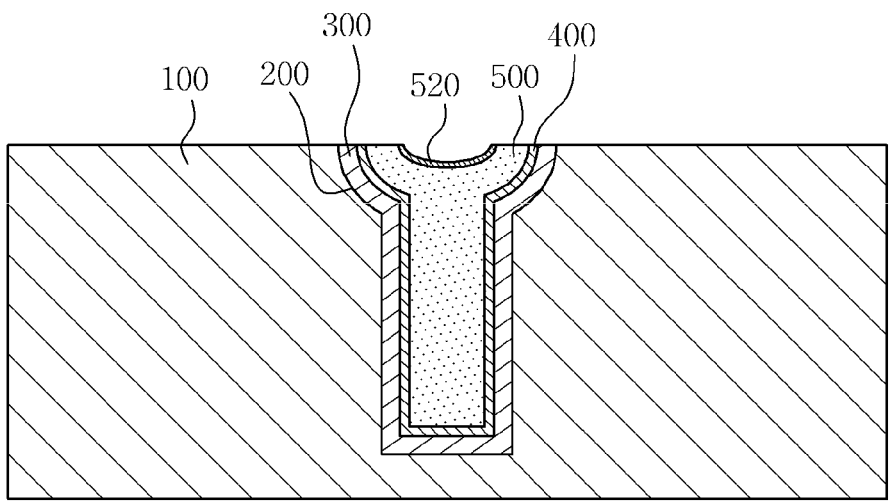

FIG. 6 illustrates the substrate 100 and via hole structure 200 after the process for filling the portion that is insufficiently filled with silver.

A silver flowing process is applied to the portion that is insufficiently filled with silver. The silver flowing process means a process for filling the space with silver under a vacuum state.

For example, the substrate 100 exists on a state of a first temperature range (for example, 300 to 450° C.), a state under first pressure (for example, 0.001 Torr), and a state in which a predetermined amount of oxygen exists in the air (for example, 3 mol % in the air). The state under first pressure may be considered the vacuum state. As the degree of vacuum, that is, the atmospheric pressure, is lowered, the flowing may be performed at the temperature that is lower than the first temperature.

Oxygen is added in order to perform flowing at the lower temperature in the first temperature range state and the first pressure state. That is, oxygen acts as a catalyst to perform flowing at low temperatures.

If the silver flowing process is performed in the above state, since oxygen exists in the air, the silver oxide Ag2O component 520 is created, and it may exist on the upper portion thereof that is filled with silver 500. If the silver oxide component 520 exists, it disturbs the electric connection at the upper portion of the silver 500, that is, the conductor that is filled in the via hole of the other substrate, such that conductivity may be deteriorated.

Therefore, after the silver flowing process is performed, the silver oxide component 520 that exists on the upper portion of silver 500 should be removed.

Figure 7:
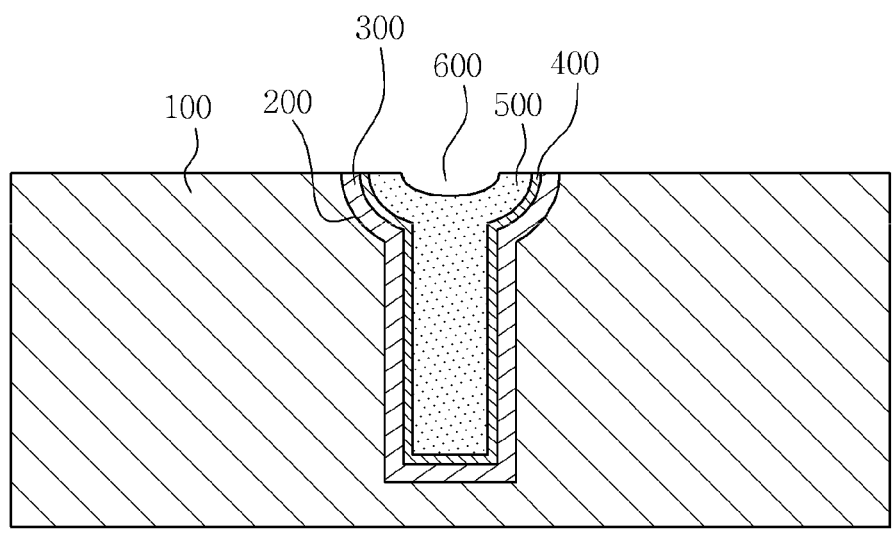

FIG. 7 illustrates the structure of the substrate 100 while the silver flowing process is performed in the embodiment of the present invention.

In the embodiment of the present invention, the method for removing the silver oxide component 520 is a method for sublimating the silver oxide component 520 at low temperatures under vacuum.

For example, the substrate 100 exists on a state of a second temperature range (for example, 190 to 300° C.), a state under first pressure, and a state in which a predetermined amount of hydrogen exists in the air (for example, 5 mol % in the air). At this time, the silver oxide component 520 is sublimated in the air, and silver 500 that has very high purity, for example, 95 to 100%, remains in the space between the barrier film 400 and the via hole structure 200, such that the via hole may be filled with the desirable conductor.

Figure 8:
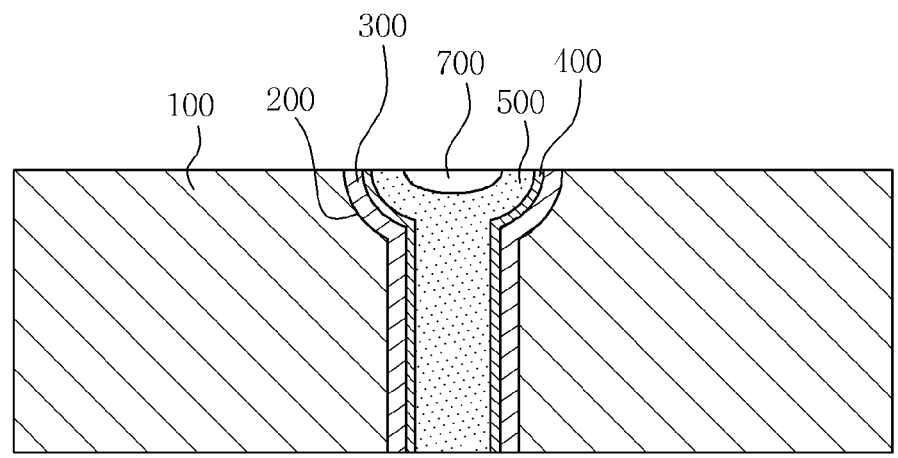

FIG. 8 illustrates the shape of the substrate 100 after the process for stacking the substrate 100 in a state in which the insulation film 300, barrier film 400, and silver 500 are formed in the via hole structure 200 of the substrate 100.

With reference to FIG. 8, as compared to FIG. 7, the via hole structure 200 is not formed, that is, the unetched side is polished and removed.

For example, in FIG. 8, the via hole structure 200 is formed on the upper portion of the substrate 100 to fill it with silver 500. At this time, since the lower portion of the substrate 100 is closed, in order to stack a plurality of substrates 100, it is necessary to make silver be exposed on the lower portion of the substrate 100.

Therefore, after the silver oxide component 520 is sublimated, the portion at which the via hole structure 200 is formed in the substrate 100 and the opposite portion are exposed to silver 500, and the step for polishing the opposite portion is performed to form the via hole.

Next, if a plurality of substrates is stacked by fixing the bonding means 700 to the groove 600 on the upper portion of silver 500 to stack the substrates 100, an integrated circuit of three dimensional substrate layered structure is created. The substrates may be electrically connected to each other through silver that is provided in the via hole in order to perform various functions of the integrated circuit.

As described above, when the via hole structure 200 is filled with silver 500, if the reduction and precipitation reaction of silver is used, the desirable conductor can be provided through a low-priced process. In addition, since silver is provided through the chemical reaction, only the silver component having very high purity is used as the conductor in the via hole, such that electric resistance is very small and desirable conductivity is obtained. In addition, since the silver particle that is generated by the reduction and precipitation reaction has a very small size, it is possible to fill the small via hole that is the practice nowadays with silver.

Figure 9:
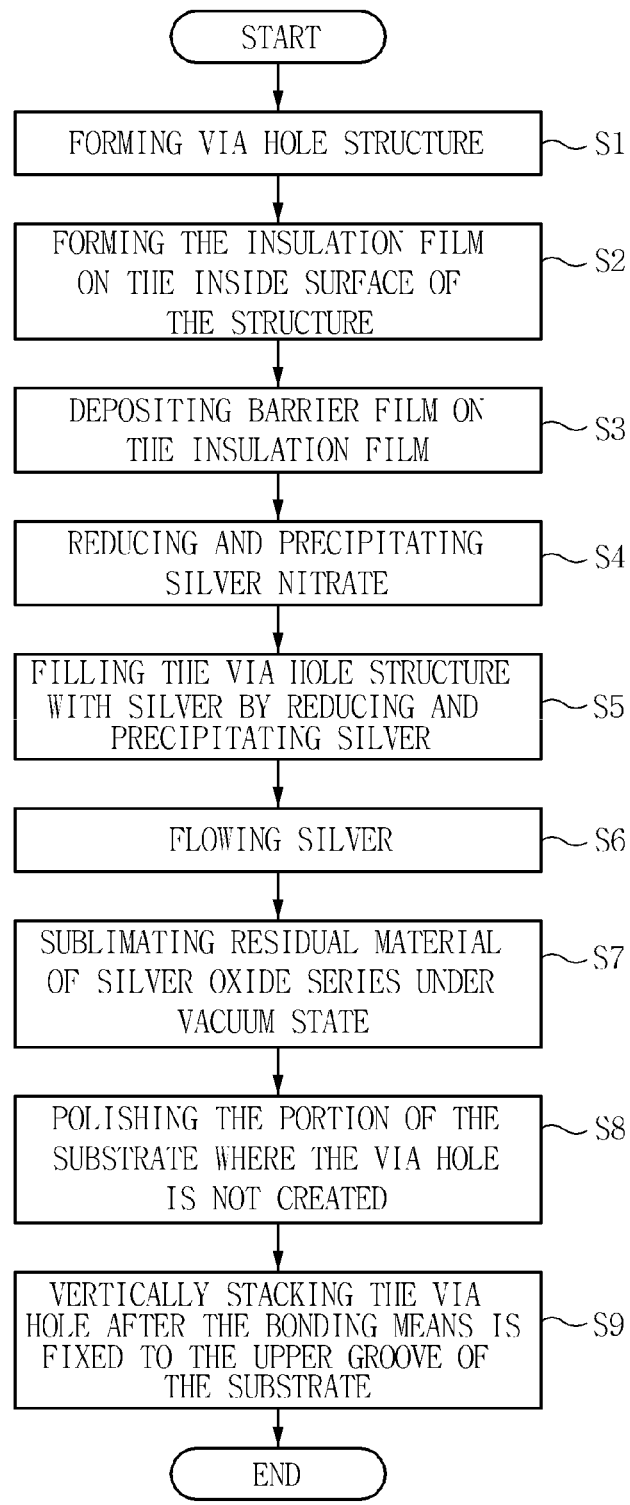
FIG. 9 is a flowchart for the method for forming the conductive via hole according to an embodiment of the present invention.

FIG. 9 is a flowchart for the method for forming the conductive via hole according to an embodiment of the present invention. Hereinafter, a portion that overlaps the description of FIGS. 1 to 8 will be omitted.

First, the via hole structure 200 is formed by etching the substrate 100 (S1). Next, the step for forming the insulation film 300 in the via hole structure 200 is performed (S2). The insulation film 300 may be made of one or more of silicon oxide film and silicon nitroxide film. As the method that is used in step S2, one or more of the ozone TEOS and high temperature LPCVD HTO method may be included.

If the insulation film 300 is formed, the step for depositing the barrier film 400 is performed to prevent diffusion of the conductor to the insulation film 300 and the interface reaction (S3). The prevention film 400 includes one or more components of TiN, WN, TiW, and Ti/Pd. Step S3 may be the step using the metal ALD method.

Next, the step for reducing and precipitating silver is performed in the silver nitrate seires compound (S4). The reduction and precipitation reaction of the silver nitrate series compound may be, for example, a reaction that reduces and precipitates silver by adding the material that includes the aldehyde group (for example, formalin, RCHO) to the alkali series (for example, ammonia) aqueous solution of the silver nitrate series compound.

Through step S4, the step for reducing and precipitating silver 500 in the via hole structure 200 is performed (S5). Step S5 is performed during step S4.

Next, the silver flowing step for filling the portion that is insufficiently filled with silver 500 in the via hole structure 200, for example, the deep valley space 510 or the void layer of silver, with silver is performed (S6).

Step S6 may be a step that is performed in a state of first temperature range, a state under first pressure, and a state in which a predetermined amount of oxygen exists in the air.

If step S6 is finished, the step that sublimates the residual material of silver oxide series that is created during the silver flowing process is performed (S7). Step S7 may be a step that is performed in a state of a first temperature range, a state under first pressure, and a state in which a predetermined amount of oxygen exists in the air.

If the residual material silver oxide series is sublimated and the via hole structure 200 is filled with only silver 500 having high purity, the step is performed to make silver be exposed on the opposite side by polishing the opposite side of the etched side to form the lower portion of the substrate, that is, the via hole structure 200 (S8). Next, after the bonding means 700 is fixed to the upper groove of the substrate, a step is performed which vertically layers the substrates 100 where the via holes are formed (S9).

Figure 10:
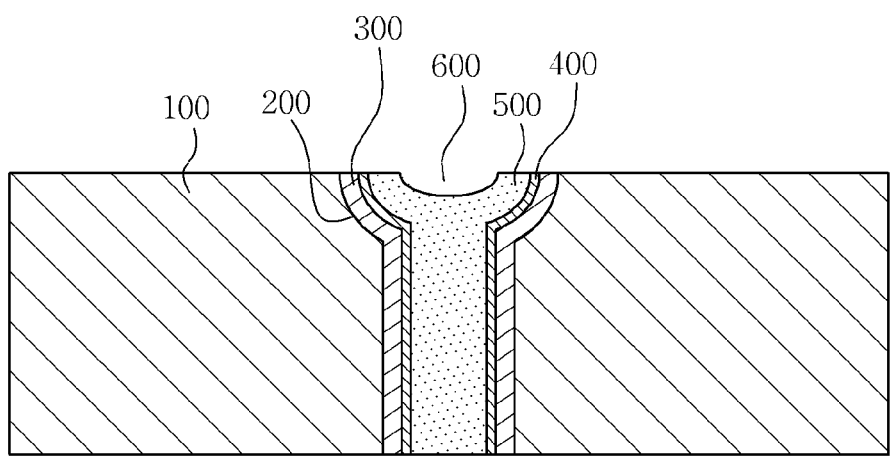
FIG. 10 illustrates a configuration of the conductive via hole that is formed by an embodiment of the present invention.

FIG. 10 illustrates a configuration of the conductive via hole that is formed by the present invention. Hereinafter, a portion that overlaps the description of FIGS. 1 to 9 will be omitted.

With reference to FIG. 10, the conductive via hole that is formed by using the method for forming the conductive via hole according to the embodiment of the present invention comprises the insulation film 300 that is formed on the inner wall of the via hole structure 200 that is formed by etching in the substrate 100, the barrier film 400 that is formed on the surface of the insulation film to prevent the diffusion of the conductive metal and interface reaction, and silver 500 that is provided between the surface of the barrier film 400 and the via hole structure 200 through the reduction and precipitation reaction and has purity of 95 to 100%. A groove 600 that is generated through the reduction and precipitation reaction of silver 500 and the silver flowing process may exist in the upper portion of silver 500, that is, the input portion of the via hole structure 200.

The purity may be changed according to the degree of sublimation of residual material of silver oxide series according to the reduction and precipitation reaction of silver and the silver flowing reaction as shown in FIGS. 1 to 9.

Silver 500 may mean silver that is reduced and precipitated by adding the material that includes the aldehyde group (for example, formalin) to the alkali (for example, ammonia) aqueous solution of the silver nitrateseries compound.

In addition, the insulation film 300 may include one or more of silicon oxide film ($SiO_2$) and silicon nitroxide film (SiON). The barrier film 400 includes one or more components of TiN, WN, TiW, and Ti/Pd.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims. Accordingly, the actual technical protection scope of the present invention must be determined by the spirit of the appended claims.

What is claimed is:

1. A method for forming a conductive via hole, the method comprising:
   filling inside of a via hole structure that is formed in an upper portion of a substrate with silver by using a reduction and a precipitation of the silver in order to connect a plurality of stacked substrates by a conductor;
   filling a portion that is not filled with silver inside of the via hole structure by flowing silver thereinto; and
   sublimating residual material of silver oxide series, which is generated during the flowing silver, on an upper layer inside of the via hole structure filled with the silver.

2. The method of claim 1, wherein the filling inside of the via hole structure uses the reduction and precipitation reaction of a silver nitrate ($AgNO_3$) series compound.

3. The method of claim 2, wherein the filling inside of the via hole structure reduces and precipitates silver by adding a material that has an aldehyde group (—CHO) to an alkali series aqueous solution of the silver nitrate series compound.

4. The method of claim 1, wherein the filling the portion is performed in a state of a first temperature range, a state under a first pressure, and a state in which a predetermined amount of oxygen is included in the air.

5. The method of claim 4, wherein the first temperature range is 300 to 450° C.

6. The method of claim 4, wherein the state under the first pressure is an atmospheric pressure under 0.001 Torr.

7. The method of claim 1, wherein the sublimating is performed in a state of a second temperature range, a state under a first pressure, and a state in which a predetermined amount of hydrogen is included in the air.

8. The method of claim 7, wherein the second temperature range is 190 to 300° C.

9. The method of claim 1, further comprising forming an insulation film on an inner wall of the via hole structure.

10. The method of claim 9, wherein the forming the insulation film uses at least one methods of ozone TEOS (Tetraethyl orthosilicate) and high temperature LPCVD HTO (Low Pressure Chemical Vapor Deposition High Temperature Oxide).

11. The method of claim 9, wherein the insulation film comprises silicon oxide film ($SiO_2$) and/or silicon nitroxide film (SiON).

12. The method of claim 9, further comprising depositing a barrier film on the surface of the insulation film to prevent diffusion of a conductive metal and interfacial reaction.

13. The method of claim 12, wherein the barrier film includes at least one of TiN, WN, TiW, and Ti/Pd.

14. The method of claim 12, wherein the depositing the barrier film uses a method of metal ALD (Atomic Layer Deposition).

15. The method of claim 1, further comprising making the silver which is filled inside of the via hole structure, exposed on a side by polishing the side, wherein the side is the opposite side of the upper portion in which the via hole is formed.

* * * * *